United States Patent
Jang et al.

(10) Patent No.: US 10,014,523 B2
(45) Date of Patent: Jul. 3, 2018

(54) MANUFACTURING APPARATUS OF HIGH PURITY MOX NANOSTRUCTURE AND METHOD OF MANUFACTURING THE SAME

(71) Applicant: KOREA INSTITUTE OF ENERGY RESEARCH, Daejeon (KR)

(72) Inventors: Bo-Yun Jang, Daejeon (KR); Joon-Soo Kim, Daejeon (KR); Jin-Seok Lee, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 13 days.

(21) Appl. No.: 14/767,578

(22) PCT Filed: Feb. 13, 2013

(86) PCT No.: PCT/KR2013/001110
§ 371 (c)(1),
(2) Date: Aug. 12, 2015

(87) PCT Pub. No.: WO2014/126273
PCT Pub. Date: Aug. 21, 2014

(65) Prior Publication Data
US 2016/0020463 A1    Jan. 21, 2016

(30) Foreign Application Priority Data
Feb. 13, 2013    (KR) .................. 10-2013-0015197

(51) Int. Cl.
*H01M 4/48* (2010.01)
*C23C 16/22* (2006.01)
(Continued)

(52) U.S. Cl.
CPC ............. *H01M 4/483* (2013.01); *C23C 16/22* (2013.01); *C23C 16/45563* (2013.01);
(Continued)

(58) Field of Classification Search
CPC .. A63F 13/10; A63F 13/63; A63F 2300/1093; A63F 2300/6009;
(Continued)

(56) References Cited

U.S. PATENT DOCUMENTS 4,545,975 A * 10/1985 Kobayashi ............. B82Y 30/00
422/111
5,084,091 A    1/1992 Yolton
(Continued)

FOREIGN PATENT DOCUMENTS

EP        0834582 A2    4/1998
KR    1020030032763 A    4/2003
(Continued)

OTHER PUBLICATIONS

Translation of KR 101081864B1 (2011).*
International Search Report for PCT/KR2013/001110 dated Oct. 23, 2013.

*Primary Examiner* — Scott Kastler
*Assistant Examiner* — Michael Aboagye
(74) *Attorney, Agent, or Firm* — Hauptman Ham, LLP

(57) ABSTRACT

There is disclosed that a MOx nanostructure manufacturing apparatus and a manufacturing method thereof can not only supply a reaction gas more effectively to the surface of a molten metal with ease by injecting a carrier gas to the surface of the molten metal above a graphite crucible as well as bringing the reaction gas in the lower side of the graphite crucible, but also maximize volatilization rates through an inflow of the reaction gas from the lower portion toward the upper of the graphite crucible.

7 Claims, 7 Drawing Sheets

(51) Int. Cl.
*C23C 16/455* (2006.01)
*H01M 4/04* (2006.01)
*B82Y 40/00* (2011.01)
*H01M 4/02* (2006.01)

(52) U.S. Cl.
CPC .......... *H01M 4/0471* (2013.01); *B82Y 40/00* (2013.01); *H01M 2004/021* (2013.01); *H01M 2004/027* (2013.01); *H01M 2004/028* (2013.01)

(58) Field of Classification Search
CPC ....... A63F 2300/6607; A63F 2300/695; G06T 13/40; B82Y 40/00; C23C 16/22; C23C 16/45563; H01M 2004/021; H01M 2004/027; H01M 2004/028; H01M 4/0471; H01M 4/483; H01P 1/02
USPC .............. 266/208; 422/186.04, 240, 186.29; 977/775, 891, 948; 423/348, 325; 428/402
See application file for complete search history.

(56) References Cited

U.S. PATENT DOCUMENTS

| | | | |
|---|---|---|---|
| 5,096,685 A * | 3/1992 | Funahashi | B82Y 30/00 423/325 |
| 5,272,720 A | 12/1993 | Cignetti et al. | |
| 7,384,448 B2 | 6/2008 | Johnson, Jr. | |
| 7,972,586 B2 * | 7/2011 | Oh | C01F 5/04 423/497 |
| 2006/0037733 A1 * | 2/2006 | Mon | B22D 11/0401 164/503 |
| 2010/0044002 A1 * | 2/2010 | Leffew | B22D 1/005 164/266 |
| 2012/0251710 A1 * | 10/2012 | Jang | C01B 33/181 427/122 |
| 2016/0002055 A1 * | 1/2016 | Kim | C01B 33/181 423/325 |

FOREIGN PATENT DOCUMENTS

KR     1020110075106 A     7/2011
KR     101081864 B1     11/2011

* cited by examiner

US 10,014,523 B2

MANUFACTURING APPARATUS OF HIGH PURITY MOX NANOSTRUCTURE AND METHOD OF MANUFACTURING THE SAME

CROSS REFERENCE TO RELATED APPLICATION

This application claims the priority of Korean Patent Application No. 10-2013-0015197 filed Feb. 13, 2013 in the Korean Patent and Trademark Office. Further, this application is the National Phase application of International Application No PCT/KR2013/001110 filed Feb. 13, 2013, which is incorporated herein by reference in its entirety.

TECHNICAL FIELD

The present invention relates to manufacturing apparatus of high purity MOx nano structure and method of manufacturing the same, and more particularly, to high purity MOx nanostructure manufacturing apparatus which can produce a large amount of high purity nanostructure through preventing the formation of a surface oxide film as well as increasing the volatilization rate of MOx nanostructure, by injecting a carrier gas to the surface of molten metal above a graphite crucible as well as bringing the reaction gas into the molten metal in the lower side of the graphite crucible, and to a manufacturing method thereof.

BACKGROUND ART

In general, a carbon electrode is used as cathode of the lithium ion battery. The carbon electrode has an advantage that charging and discharging efficiencies of batteries are excellent. However, because of the low theoretical capacity of 375 mAh/g, it is limited to use as a cathode material for next-generation lithium ion batteries, which require a high battery capacity.

For example, in the case of silicon (Si) used as a cathode material for a lithium ion battery, it has a high theoretical capacity of about 4200 mAh/g. When the lithium ion battery is charged, high volume expansion up to 400% is caused because $Li_{4.4}$ and Si reacts to form $Li_{4.4}Si$. Such a high volume expansion causes a crack or a short to the cathode of a lithium ion battery consisting of a silicon material.

In particular, in the case of silicon (Si), when its particle size changes from micro size (μm) to nano size (nm), it is known that the stress caused by the volume expansion is reduced. However, the nano-sized silicon also has a problem that the crack or the short of batteries occur by the volume expansion.

Related Prior Art is the Republic of Korea Patent Publication No. 10-2003-0032763 (Apr. 26, 2003 published), where a nanoparticle manufacturing apparatus and a nanoparticle manufacturing method using the apparatus are disclosed.

DISCLOSURE

Technical Problem

An aspect of the present invention is to provide a manufacturing apparatus of high purity MOx nano structure and method of manufacturing the same which can produce a large amount of high purity nanostructures through preventing the formation of a surface oxide film as well as increasing the volatilization rate of MOx nanostructures, by injecting a carrier gas to the surface of molten metal above a graphite crucible as well as introducing the reaction gas into the molten metal in the lower side of the graphite crucible.

Technical Solution

In accordance with a first aspect of the present invention, there is provided a MOx nanostructure manufacturing apparatus, including; a vacuum chamber; a graphite crucible provided in the vacuum chamber, the graphite crucible including a wall surface and a plurality of slits cutting a portion of the wall surface, metallic raw materials being charged into the graphite crucible; an induction melting unit including a refractory wall surrounding an outside of the graphite crucible and an induction coil configured to form molten metal by induction heating the metallic raw materials charged into the graphite crucible; a porous castable structure supporting bottom surfaces of the graphite crucible and the refractory wall; a carrier gas injection unit arranged above the graphite crucible in a spaced-apart relationship and configured to inject a carrier gas to a surface of the molten metal; a reaction gas injection unit arranged to be inserted into a side surface of the porous castable structure and supplying a reaction gas toward the graphite crucible via an inner portion of the porous castable structure; and a collecting unit arranged above the graphite crucible in a spaced-apart relationship and configured to collect MOx vapor volatilized from the reaction between the molten metal and the reaction gas.

In accordance with a second aspect of the present invention, there is provided a MOx nanostructure manufacturing method, including: step (a) of charging metallic raw materials into a graphite crucible; step (b) of forming molten metal by induction heating of the metallic raw materials charged into the graphite crucible; step (c) of injecting a carrier gas to a surface of the molten metal while injecting a reaction gas from an outer lower portion of the graphite crucible; and step (d) of collecting MOx nanostructures by cooling and condensing the MOx vapor volatilized by the reaction between the molten metal and the reaction gas.

Advantageous Effects

A MOx nanostructure manufacturing apparatus and a manufacturing method thereof according to the present invention can not only supply the reaction gas more effectively to the surface of the molten metal with ease by injecting a carrier gas to the surface of molten metal above a graphite crucible as well as bringing the reaction gas into the molten metal in the lower side of the graphite crucible, but also maximize volatilization rates through an inflow of the reaction gas from the lower part toward the upper of the graphite crucible.

In addition, a MOx nanostructure manufacturing apparatus and a manufacturing method thereof according to the present invention can produce a large amount of high purity nanostructure through preventing the formation of a surface oxide film as well as increasing the volatilization rate of MOx nanostructure, by introducing the reaction gas into the molten metal in the lower side of a graphite crucible and by the reaction between the molten metal and the reaction gas above the graphite crucible.

BEST MODE

The above and other aspects, features, and advantages of the present invention will become apparent from the detailed description of the following embodiments in conjunction with the accompanying drawings. It should be understood that the present invention is not limited to the following embodiments and may be embodied in different ways, and that the embodiments are provided for complete disclosure and a thorough understanding of the present invention by those skilled in the art. The scope of the present invention will be defined only by the claims. Identical components will be designated by like reference symbols throughout the specification.

With reference to the accompanying drawings, a high purity MOx nanostructure manufacturing apparatus and a manufacturing method thereof will be described in detail according to preferable embodiments of the present invention.

Figure 1:
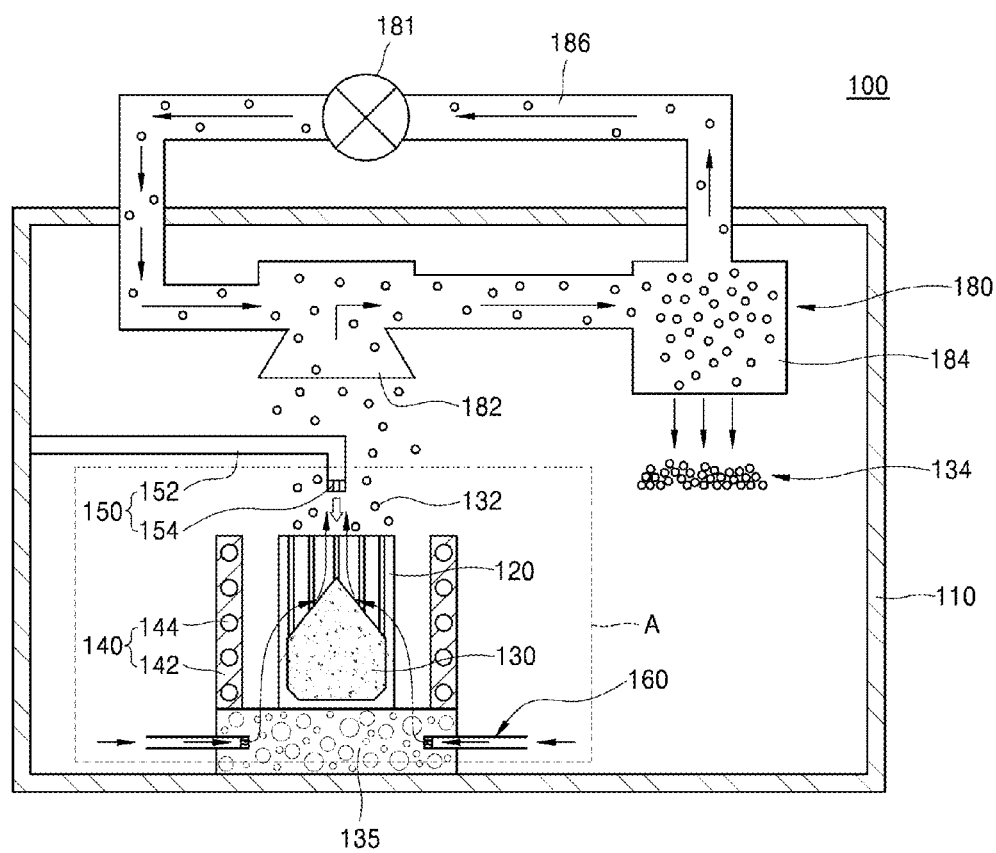
FIG. 1 is a sectional view of a MOx nanostructure manufacturing apparatus according to embodiments.
Figure 2:
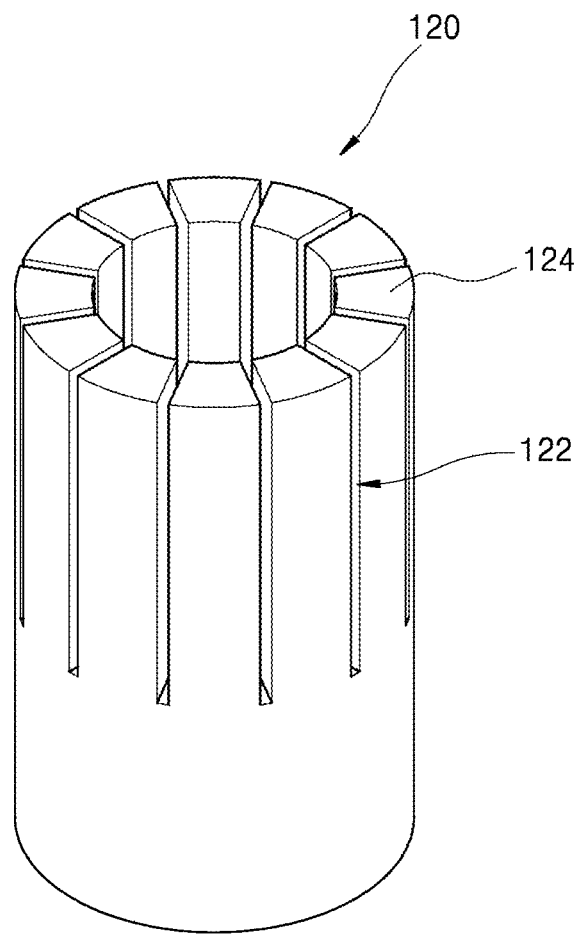
FIG. 2 is an enlarged perspective view showing a graphite crucible in FIG. 1.
Figure 3:
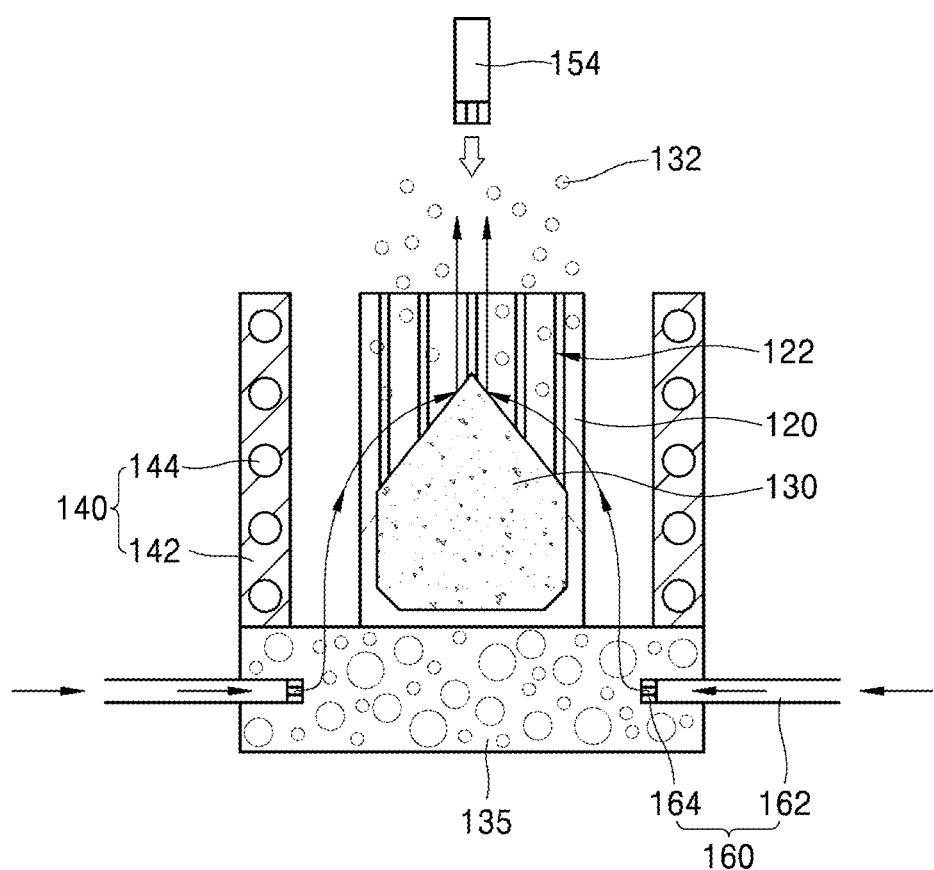
FIG. 3 is an enlarged sectional view showing a portion A in FIG. 1.

FIG. 1 is a sectional view showing the MOx nanostructure manufacturing apparatus according to embodiments of the present invention, FIG. 2 is an enlarged perspective view showing a graphite crucible in FIG. 1, and FIG. 3 is an enlarged sectional view showing a portion A in FIG. 1.

Referring to FIGS. 1 to 3, the MOx nanostructure manufacturing apparatus 100 according to embodiments of the present invention includes a vacuum chamber 110, a graphite crucible 120, an induction melting unit 140, a carrier gas injection unit 150, a reaction gas injection unit 160 and a collecting unit 180.

Vacuum Chamber

The vacuum chamber 110 provides a sealing space for manufacturing a MOx nanostructure 134. A clean vacuum state is preferably maintained inside the vacuum chamber 110.

Graphite Crucible

The graphite crucible 120 is arranged in the vacuum chamber 110. The graphite crucible 120 has a cylindrical shape that the upper side is opened and metallic raw materials are charged inwards. In this case, silicon (Si), tin (Sn), germanium (Ge), aluminum (Al), titanium (Ti), gallium (Ga), boron (B), or the like may be used as the metallic raw materials. As illustrated in FIG. 2, the graphite crucible 120 is made of a cylindrical structure in which the upper side is opened, and provided a plurality of slits 122 to cut a portion of the wall surface. Therefore, the graphite crucible 120 is divided into individual segments 124 by a plurality of slits 122.

In this case, the metallic raw materials charged into the interior of the graphite crucible 120 may be melted directly by electromagnetic induction heating through the induction melting unit 140, or indirectly melted by the graphite crucible 120 which is inductively heated through the induction melting unit 140.

Induction Melting Unit

The induction melting unit 140 includes a refractory wall 142 and an induction coil 144.

The refractory wall 142 is formed in the shape surrounding the outside of the graphite crucible 120. The refractory wall 142 may be a shape of a circular hoop, but it is not necessarily limited thereto.

The induction coil 144 serves to form molten metal 130 by induction heating the metallic raw materials charged into the graphite crucible 120. In this case, the induction coil 144 may be embedded in a wall of the refractory wall 142. Although not illustrated in the drawings, the induction coil 144 may be attached to the inner wall of the refractory wall 142.

The induction melting unit 140 forms molten metal 130 after melting by induction heating the metallic raw materials charged into the graphite crucible 120.

An electromagnetic field that caused by the induction melting unit 140 is directed toward a center of the inside of the graphite crucible 120. By the electromagnetic field by such induction heating, the molten metal 130 is separated from a side wall of the graphite crucible 120 and rises to the center of the graphite crucible 120, and a surface area of the molten metal 130 is increased by stirring by the electromagnetic field acting on the molten metal 130.

On the other hand, an alternating current applied to the induction coil 144 of the induction melting unit 140 preferably has a frequency below 10 kHz. When the frequency to be applied to the induction coil 144 is lowered below 10 kHz, it is possible to maximize the flow of metal to be melted because the electromagnetic field can be formed to a deep portion of inside the molten metal 130. This flow maintains a more unstable surface state of the molten metal 130, and through it, it is possible to improve the efficiency of the volatilization of the molten metal 130.

For example, silicon, one of the metallic materials, is indirectly heated by the heat applied to the graphite crucible 120 in an initial state because it has low electric conductivity at about 700° C. or less, and, in a temperature above about 700° C., the electric conductivity of silicon becomes rapidly high so that electromagnetic induction melting is mainly performed.

Porous Castable Structure

A porous castable structure 135 serves to support a bottom of the graphite crucible 120 and the refractory wall 142. The porous castable structure 135 has a plurality of pores therein. It is preferable to use an alumina castable as a material of the porous castable structure 135.

Carrier Gas Injection Unit

A carrier gas injection unit 150 is arranged above the graphite crucible 120 in a spaced-apart relationship, and it serves to inject a carrier gas to a surface of the molten metal 130.

The carrier gas injection unit 150 includes a carrier gas supply pipe 152 and a carrier gas injection nozzle 154.

The carrier gas supply pipe 152 serves to supply the carrier gas stored in a carrier gas storage tank (not shown) to the carrier gas injection nozzle 154.

The carrier gas injection nozzle 154 is arranged to an end of the carrier gas supply pipe 152 and serves to inject the carrier gas to the surface of the molten metal 130. In particular, the carrier gas injection nozzle 154 is arranged at the end of the carrier gas supply pipe 152, and provided to increase the volatilization rate of MOx vapor 132 volatilized from the reaction between molten metal 130 and a reaction gas inside the graphite crucible 120. That is, the carrier gas is injected for merely increasing the volatilization rate, not participating in the reaction with the molten metal 130. Ar, $H_2$, $H_2CH_4$, $C_2H_6$, $C_3H_8$, $C_4H_{10}$, $C_5H_{12}$, $C_6H_{14}$ and the like can be used as the carrier gas. These gases may be supplied in a manner of being alone or in combination of two or more. In addition, it is possible to form a hydrogen passivation on the surface of the reactant by using $H_2$ gas mixture for the surface control of the reactant generated by the reaction between the molten metal and the reaction gas, or to carry out surface carbon coating by using gas mixture of such as $CH_4$, $C_2H_6$, $C_3H_8$, $C_4H_{10}$, $C_5H_{12}$ and $C_6H_{14}$.

Reaction Gas Injection Unit

The reaction gas injection unit 160 is arranged to be inserted into a side of the porous castable structure 135 and serves to supply the reaction gas in the direction of the graphite crucible 120 by way of an inner portion of the porous castable structure 135.

The reaction gas injection unit 160 includes a reaction gas supply pipe 162 and a reaction gas injection nozzle 164. The reaction gas supply pipe 162 is arranged so as to extend from an outer wall to a center of the porous castable structure 135, and it is inserted into the inner portion of the porous castable structure 135. The reaction gas supply pipe 162 is supplied the reaction gas from the reaction gas storage tank (not shown).

The reaction gas injection nozzle 164 is arranged to an end of the reaction gas supply pipe 162 and inserted into the inner portion of the porous castable structure 135, and injects the reaction gas into the inner portion of the porous castable structure 135. In this case, the reaction gas is sucked toward the graphite crucible 120 through a plurality of pores that is provided on the porous castable structure 135. As in the present invention, when the reaction gas injection nozzle 164 is provided on the lower side of the graphite crucible 120, it not only can be facilitated that the reaction gas is supplied more efficiently to the surface of the molten metal 130, but also the volatilizing rate is maximized since the reaction gas is introduced upward from an lower portion of the graphite crucible 120.

In particular, it is desirable that a tip end portion of the reaction gas injection nozzle 164 is arranged to a position corresponding between an inner wall of the refractory crucible 142 and an outer wall of the graphite crucible 120, which is to guide the reaction gas to easily flow into the graphite crucible 120.

Here, the reaction gas injected from the reaction gas injection nozzle 164 of the gas injection unit 160 is injected from an inner bottom surface of the refractory crucible 142 toward the graphite crucible 120, and the reaction gas flows into the interior of the graphite crucible 120 through the slits 122 of the graphite crucible 120 and generates a MOx vapor 132 by a reaction with the molten metal 130 inside the graphite crucible 120. The MOx vapor 132 is volatilized and flows into the collecting unit 180, which is arranged above the graphite crucible 120 in a spaced-apart relationship. In this case, it is preferred that the reaction gas is configured to be injected immediately before the metallic raw material melted by induction heating by the induction melting unit 140 is formed the molten metal 130.

In this case, Ar, $H_2$, $O_2$, $H_2O$ or the like may be used as the reaction gas. These gases may be used alone or in a mixture of two or more. If doping is required for a manufactured MOx, it is also possible to mix doping gases such as PH3, B2H6. At this time, x value in MOx may be determined by a variety of partial pressure of a reaction gas injected through the reaction gas injection unit 160. In addition, a manufactured grain size and shape of the SiOx nanostructure may be determined according to a flow rate of the reaction gas and a shape and location of the reaction gas supply pipe 162.

Collecting Unit

A collecting unit 180 is arranged above the graphite crucible 120 in a spaced-apart relationship, and serves to collect the MOx vapor 132 volatilized from the reaction between the molten metal 130 and the reaction gas. The MOx vapor 132 is introduced into the collecting unit 180 and generates the MOx nanostructure 134 after cooling and condensation.

At this time, the collecting unit 180 may include a vapor movement section 182, a collecting section 184 and a gas circulation section 186.

The vapor movement section 182 is provided at a position corresponding to the graphite crucible 120. As a result, the MOx vapor 132 volatilized by the induction melting inside the graphite crucible 120 is introduced into the vapor movement section 182.

The collecting unit 184 obtains the MOx nanostructure 134 that is generated by cooling and condensing the MOx vapor 132 that flows through the vapor movement section 182. Among MOx vapor 132 flowing into this collecting section 184, some of which are cooled and condensed generating the MOx nanostructure 134, and the other of which is introduced into the gas circulation section 186. At this time, the MOx vapor 132 is transferred by using the pressure difference generated by controlling the pressure of the gas injection section 182 and the collecting section 184 differently.

The gas circulation section 186 circulates MOx vapor 132 not cooled and condensed in the collecting section 184 and reintroduces it into the vapor movement section 182. For this purpose, the gas circulation section 186 may have a circulation pump 181 for circulating MOx vapor 132.

The MOx nanostructure manufacturing apparatus according to the above described embodiment of the present invention has an effect that it can not only supply the reaction gas more effectively to the surface of the molten metal with ease by injecting a carrier gas to the surface of molten metal above the graphite crucible as well as bringing the reaction gas into the molten metal in the lower side of the graphite crucible, but also maximize volatilization rates because of an inflow of the reaction gas from the lower part toward the upper of the graphite crucible.

In addition, in the present invention, the reaction gas supplied while heating the graphite crucible moves in the direction of the graphite crucible because of the convection by the difference in temperature, and the reaction gas moved toward the graphite crucible is sucked into the interior of the graphite crucible through the plurality of slits formed on the outer wall of the graphite crucible. And then, the reaction gas reacts with the surface of the molten metal and generates MOx vapor. MOx vapor generated in this manner is volatilized to the upper portion of the graphite crucible, due to a low vapor pressure. In this case, it is possible to increase the volatilization rate by supplying the carrier gas to the surface of the MOx vapor generated by the reaction between the molten metal and the reaction gas from the carrier gas injection nozzle arranged above the graphite crucible in a spaced-apart relationship.

Therefore, the MOx nanostructure manufacturing apparatus according to the present invention can produce a large amount of high purity nanostructure through preventing the formation of a surface oxide film as well as increasing the volatilization rate of the MOx nanostructure by introducing the reaction gas into the molten metal in the lower side of the graphite crucible and injecting a carrier gas to the surface of molten metal above a graphite crucible.

Figure 4:
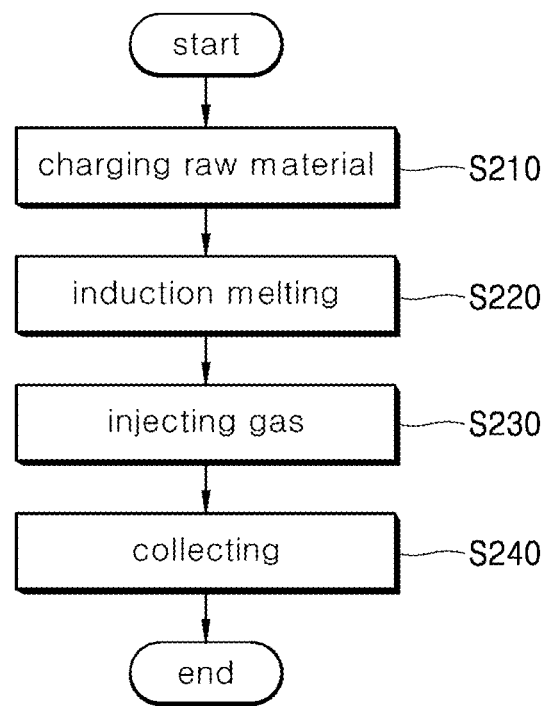
FIG. 4 is a process flowchart illustrating a MOx nanostructure manufacturing method according to the embodiments of the present invention.

FIG. 4 is a process flow chart illustrating a MOx nanostructure manufacturing method according to the embodiment of the present invention.

Referring to FIG. 4, the MOx nanostructure manufacturing method according to illustrated embodiments of the present invention includes a raw material charging step S210, an induction melting step S220, a gas injection step S230 and a collecting step S240.

Raw Material Charging

In the raw material charging step S210, metallic raw materials are charged in the graphite crucible. In this case, the graphite crucible is arranged inside a vacuum chamber. The graphite crucible is made of a cylindrical structure in which the upper side is opened, and may be divided into individual segments by a plurality of slits for cutting the portion of the wall surface. In this case, silicon (Si), tin (Sn), germanium (Ge), aluminum (Al), titanium (Ti), gallium (Ga), boron (B), or the like may be used as the metallic raw materials.

Induction Melting

In the induction melting step S220, molten metal is formed by the induction heating of the metallic raw material charged in the graphite crucible.

In this case, by the electromagnetic field caused by the induction heating, the molten metal is separated from the side wall of the graphite crucible and rises to the center thereof, and a surface area the molten metal is increased by stirring by electromagnetic field acting on the molten metal. Here, it is preferable to apply an alternating current below 10 kHz to the induction coil surrounding an outer peripheral surface of the graphite crucible. When the frequency to be applied to the induction coil is lowered below 10 kHz, it is possible to maximize the flow of metal to be melted because the electromagnetic field can be formed to a deep portion of inside the molten metal. This flow maintains a more unstable surface state of the molten metal, and through it, it is possible to improve the efficiency of the volatilization of the molten metal.

Gas Injection

In the gas injection step S230, a carrier gas is injected to the surface of the molten metal while a reaction gas is injected at the outer lower portion of the graphite crucible. In this case, it is preferable that the reaction gas is introduced toward the graphite crucible via the interior of the porous castable structure by using a reaction gas injection nozzle to be inserted into the side of a porous castable structure for supporting the graphite crucible.

That is, in this step, the reaction gas supplied while the graphite crucible is heated moves toward the graphite crucible because of the convection by the difference in temperature, and the reaction gas having moved toward the graphite crucible is sucked into the interior of the graphite crucible through the plurality of slits formed on the outer wall of the graphite crucible. And then, the reaction gas reacts with the surface of the molten metal and generates MOx vapor. MOx vapor generated in this manner is volatilized to the upper portion of the graphite crucible, due to low vapor pressure. In this case, it is possible to increase the volatilization rate by supplying the carrier gas to the surface of the MOx vapor generated by the reaction between the molten metal and the reaction gas from the carrier gas injection nozzle arranged above the graphite crucible in a spaced-apart relationship. Ar, $H_2$, $H_2CH_4$, $C_2H_6$, $C_3H_8$, $C_4H_{10}$, $C_5H_{12}$, $C_6H_{14}$ and the like can be used as the carrier gas. These gases may be supplied in a manner of being alone or in combination of two or more. In addition, it is possible to form a hydrogen passivation on the surface of the reactant by using $H_2$ gas mixture for the surface control of the reactant generated by the reaction between the molten metal and the reaction gas, or to carry out surface carbon coating by using gas mixture such as $CH_4$, $C_2H_6$, $C_3H_8$, $C_4H_{10}$, $C_5H_{12}$ and $C_6H_{14}$.

Here, Ar, $H_2$, $O_2$, $H_2O$ or the like may be used as the reaction gas. These gases may be used alone or in a mixture of two or more. If doping is required for a manufactured MOx, it is also possible to mix doping gases such as $PH_3$, $B_2H_6$. At the gas injection step S230, x value in SiOx may be determined by a variety of partial pressure of a reaction gas. In addition, a manufactured grain size and shape of the SiOx nanostructure may be determined according to a flow rate of the reaction gas and a shape and location of the reaction gas supply pipe.

Collecting

In the collecting step S240, the MOx nanostructure is collected by cooling and condensing the MOx vapor volatilized from the reaction between the molten metal and the reaction gas.

And above, the MOx nanostructure manufacturing method according to embodiment of the present invention may be terminated.

MOx nanostructures manufactured using the above MOx nanostructure manufacturing method have an average diameter of 50 nm or less, and has a mixed structure of nanoparticles and nanowires. For example, the SiOx nanostructure made of the patent technology have a high battery capacity of 1500 mAh/g, and charging and discharging efficiencies can be improved more than three times compared to the carbon electrode since the particle size is made of a nano-size of less than about 50 nm. In addition, when the nano-size MOx nanostructure manufactured by the above method is used as cathode material for lithium-ion batteries, volume expansion does not occur. Therefore, a problem such as a crack or a short circuit can be prevented.

EXAMPLE

Hereinafter, the configuration and operation of the present invention through the preferred embodiment of the present invention will be described in more detail. However, it will be set forth as a preferred example of the present invention and not be construed as limiting the present invention thereby in any sense.

If the information is not described herein, it will not be specifically described because those skilled in the art can sufficiently infer technically.

1. Sample Preparation

Example 1

First, silicon, as a metallic raw material, is charged into the inside of the crucible. The crucible has an outer diameter of 90 mm, an internal diameter of 60 mm, a height of 150 mm, and 12 slits with 15° interval, each slit having 1 mm width.

An induction coil with a diameter of 8 mm was wound 10 times around the upper portion of the crucible, and through the induction coil, an alternating current having a frequency of 6.7 kHz was applied.

After the silicon of 250 g was charged, the vacuum of the chamber was maintained for more than one hour in 5~10 torr. After that, Ar gas was injected to form operation vacuum of 2 torr.

The power applied for melting the silicon is the region of 0~20 kW, and was raised 2 kW per 5 minutes for 50 to 60 minutes. When an electric power of 16 kW was applied, the charged silicon began to melt from the center, and all charged silicon was melted while the molten silicon moving from the center toward the outer wall.

Immediately after the molten metal was formed, the SiOx nanostructure was manufactured and collected by supplying gas mixture of 0.1 vol % $O_2$/Ar as the reaction gas from the lower side of the molten metal and supplying the Ar gas of 5 situ as the carrier gas from the upper side of the molten metal. After that, the production yield per unit time was measured.

Example 2

Except the supply of gas mixture of 0.5 vol % $O_2$/Ar as the reaction gas, the production yield per unit time was measured in the same manner as in example 1.

Example 3

Except the supply of gas mixture of 1.0 vol % $O_2$/Ar as the reaction gas, the production yield per unit time was measured in the same manner as in example 1.

Comparative Example 1

Immediately after the molten metal was formed, except the injection of only gas mixture of 0.1 vol % $O_2$/Ar as the reaction gas at the upper side of the molten metal, the production yield per unit time was measured in the same manner as in example 1.

Comparative Example 2

Except the injection of only gas mixture of 0.5 vol % $O_2$/Ar as the reaction gas, the production yield per unit time was measured in the same manner as in comparative example 1.

Comparative Example 3

Except the injection of only gas mixture of 1.0 vol % $O_2$/Ar as the reaction gas, the production yield per unit time was measured in the same manner as in comparative example 1.

Comparative Example 4

Immediately after the molten metal was formed, except the injection of only gas mixture of 0.1 vol % $O_2$/Ar as the reaction gas at the lower side of the molten metal, the production yield per unit time was measured in the same manner as in example 1.

Comparative Example 5

Except the injection of only gas mixture of 0.5 vol % $O_2$/Ar as the reaction gas, the production yield per unit time was measured in the same manner as in comparative example 4.

Comparative Example 6

Except the injection of only gas mixture of 1.0 volt $O_2$/Ar as the reaction gas, the production yield per unit time was measured in the same manner as in comparative example 4.

2. Measurement Results and Explanation

Table 1 shows the measurement results of the production yield per unit time of the samples per unit time in accordance with the comparative examples 1 to 6 and example 1.

TABLE 1

| classfication | Injection amount of reaction gas | Production yield (g/hr) |
| --- | --- | --- |
| Comparative example 1 | 0.1 vol % $O_2$/Ar | 0.3 |
| Comparative example 2 | 0.5 vol % $O_2$/Ar | 0.43 |
| Comparative example 3 | 1.0 vol % $O_2$/Ar | 0.46 |
| Comparative example 4 | 0.1 vol % $O_2$/Ar | 1.3 |
| Comparative example 5 | 0.5 vol % $O_2$/Ar | 3.1 |
| Comparative example 6 | 1.0 vol % $O_2$/Ar | 5.2 |
| Example 1 | 0.1 vol % $O_2$/Ar | 1.5 |
| Example 2 | 0.1 vol % $O_2$/Ar | 4.1 |
| Example 3 | 1.0 vol % $O_2$/Ar | 9.8 |

Referring to Table 1, compared to comparative example 1 to 3 that supply the reaction gas from the upper side of the graphite crucible, in the case of the comparative example 4 to 6 to supply the reaction gas from the lower side of the graphite crucible, it can be seen that the production yield per unit time is increased more than about 10 times.

In particular, in the case of example 1 to 3 supplying the reaction gas at the lower side of the graphite crucible and supplying the carrier gas at the upper side thereof, it can be seen that all production yields are increased in contrast to the same reaction gas injection amount, as compared with comparative example 4 to 6. Of these, in the case of Example 3, it was confirmed that the maximum production yield is shown as 9.8 g/hr.

Figure 5:
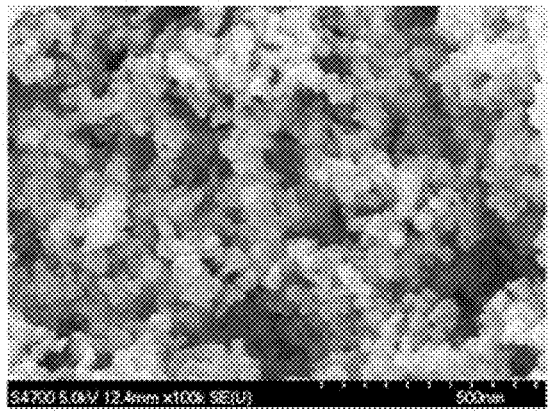
FIGS. 5 to 7 are SEM photographs of SiOx nanoparticles formed according to a comparative example 1, a comparative example 4 and an embodiment 3, respectively.
Figure 6:
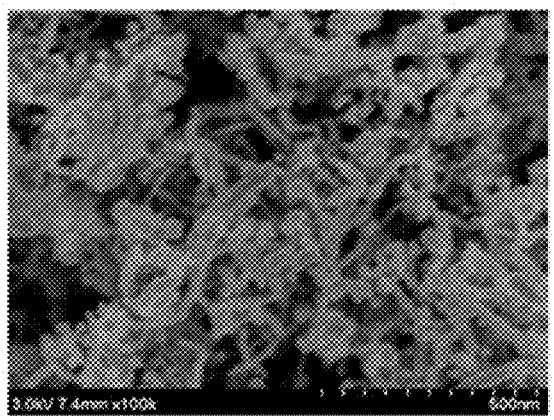
Figure 7:
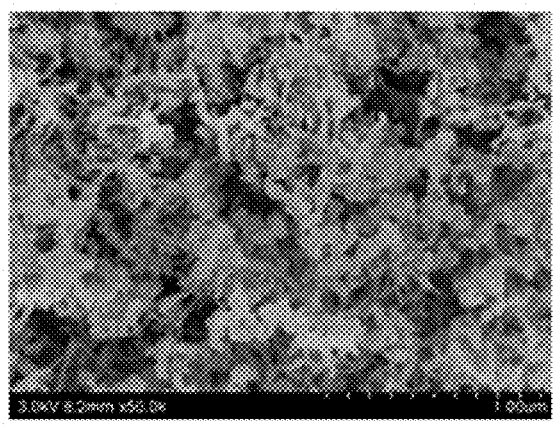
Figure 8:
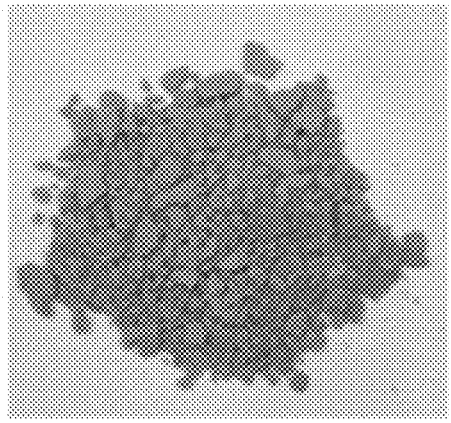
FIGS. 8 to 10 are photographs showing SiOx nanoparticles generated according to the comparative example 1, the comparative example 4 and the embodiment 3, respectively.
Figure 9:
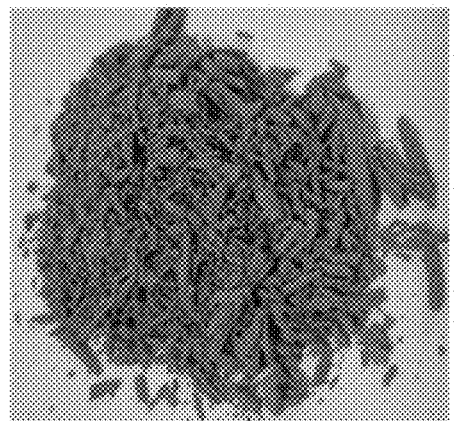
Figure 10:

On the other hand, FIGS. 5 to 7 show SEM photographs of the SiOx nanoparticles generated according to comparative example 1, comparative example 4 and example 3, and FIGS. 8 to 10 show photographs of the SiOx nanoparticles generated according to comparative example 1, comparative example 4 and example 3.

As shown in FIG. 5 and FIG. 8, when the reaction gas was supplied at the upper side of the graphite crucible as in comparative example 1, only SiOx nanoparticles were obtained. On the other hand, as shown in FIGS. 6 and 7, when the reaction gas was supplied at the lower side of the graphite crucible, it was confirmed that a mixed structure of nanoparticles and nanowires was generated regardless of whether or not the carrier gas was supplied at the upper side of the graphite crucible. At this time, FIG. 6 and FIG. 9 show the SiOx nanoparticles generated according to comparative example 4, FIG. 7 and FIG. 10 show the SiOx nanoparticles generated according to example 1.

Figure 11:
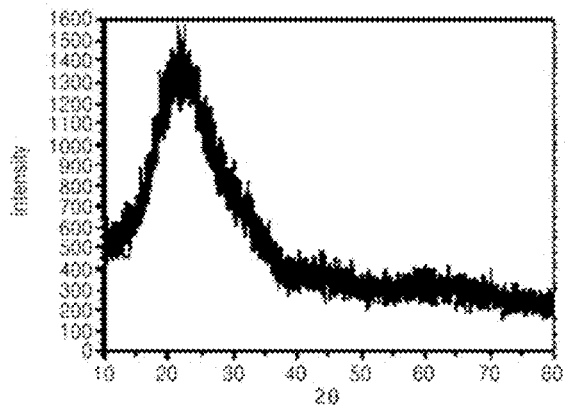
FIGS. 11 to 13 show XRD measurement results of SiOx nanoparticles formed according to the comparative example 1, the comparative example 4 and the embodiment 3, respectively.
Figure 12:
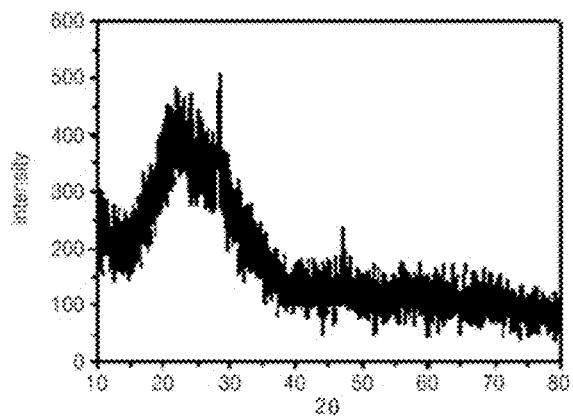
Figure 13:
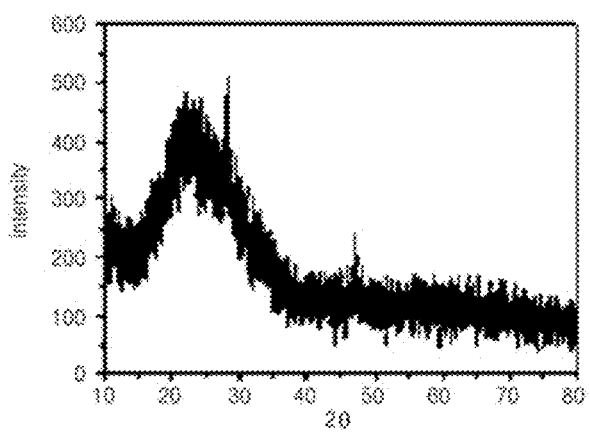

FIGS. 11 to 13 show XRD measurement results of the SiOx nanoparticles generated according to comparative example 1, comparative example 4 and example 3.

As shown in FIGS. 11 to 13, when the reaction gas was supplied at the upper side of the graphite crucible as in comparative example 1, a uniform amorphous SiOx has been generated. However, when the reaction gas was supplied from the upper side of the graphite crucible, a peak of the SiOx structure containing the crystalline structure of Si was observed regardless of whether or not the carrier gas was supplied at the upper side of the graphite crucible.

While the invention has been described with respect to the embodiments, it will be understood by those skilled in the art that various changes and modifications may be made. It is intended to cover various modifications and changes included within the spirit and scope of the present invention. Accordingly, the scope of the present disclosure shall be determined only according to the attached claims.

The invention claimed is:

1. A MOx nanostructure manufacturing apparatus, comprising;
   a vacuum chamber;
   a graphite crucible provided in the vacuum chamber, the graphite crucible including a wall surface and a plurality of slits cutting a portion of the wall surface, metallic raw materials being charged into the graphite crucible;
   an induction melting unit including a refractory wall surrounding an outside of the graphite crucible and an induction coil configured to form molten metal by induction heating the metallic raw materials charged into the graphite crucible;
   a porous castable structure supporting bottom surfaces of the graphite crucible and the refractory wall;
   a carrier gas injection unit arranged above the graphite crucible in a spaced-apart relationship and configured to inject a carrier gas to a surface of the molten metal;
   a reaction gas injection unit arranged to be inserted into a side surface of the porous castable structure and supplying a reaction gas toward the graphite crucible via an inner portion of the porous castable structure; and
   a collecting unit arranged above the graphite crucible in a spaced-apart relationship and configured to collect MOx vapor volatilized from a reaction between the molten metal and the reaction gas,
   wherein the reaction gas injection unit comprises:
      a reaction gas supply pipe extending from an outer wall of the porous castable structure to a center of the porous castable structure and inserted into the inner portion of the porous castable structure; and
      a reaction gas injection nozzle at an tip end portion of the reaction gas supply pipe and inserted into the inner portion of the porous castable structure, wherein a position of the reaction gas injection nozzle corresponds to a position between an inner wall of the refractory crucible and an outer wall of the graphite crucible, and wherein the reaction gas injection nozzle is configured to inject the reaction gas into the porous castable structure thereby supplying the reaction gas toward an upper portion of the graphite crucible.

2. The MOx nanostructure manufacturing apparatus of claim 1, wherein an alternating current below 10 kHz is applied to the induction coil.

3. The MOx nanostructure manufacturing apparatus of claim 1, wherein the metallic raw material is at least one material selected from silicon (Si), tin (Sn), germanium (Ge), aluminum (Al), titanium (Ti), gallium (Ga), or boron (B).

4. The MOx nanostructure manufacturing apparatus of claim 1, wherein the carrier gas injection unit includes a carrier gas supply pipe being supplied with the carrier gas, and a carrier gas injection nozzle arranged to a tip end portion of the carrier gas supply pipe and injecting the carrier gas to the surface of the molten metal for increasing a volatilization rate of the MOx vapor volatilized from the reaction between the molten metal and the reaction gas inside the graphite crucible.

5. The MOx nanostructure manufacturing apparatus of claim 1, wherein the reaction gas is a mixture of one or more gases selected from Ar, $H_2$, $O_2$, and $H_2O$.

6. The MOx nanostructure manufacturing apparatus of claim 5, wherein the reaction gas includes one or more doping gases selected from $PH_3$ and $B_2H_6$.

7. The MOx nanostructure manufacturing apparatus of claim 1, wherein the collecting unit includes a vapor movement section into which the MOx vapor volatilized by the reaction between the molten metal and the reaction gas is introduced, a collecting section for obtaining MOx nanostructures that is generated by cooling and condensing the MOx vapor which flows through the vapor movement section, and a gas circulation section for reintroducing MOx vapor which floats in the collecting section into the vapor movement section.

* * * * *